(12) United States Patent
Bae et al.

(10) Patent No.: US 11,075,347 B2
(45) Date of Patent: Jul. 27, 2021

(54) FLEXIBLE DISPLAY DEVICE

(71) Applicant: LG Display Co., Ltd., Seoul (KR)

(72) Inventors: YeonGyeong Bae, Goyang-si (KR); Sejong Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 16/598,970

(22) Filed: Oct. 10, 2019

(65) Prior Publication Data
US 2020/0127217 A1 Apr. 23, 2020

(30) Foreign Application Priority Data

Oct. 22, 2018 (KR) .................. 10-2018-0126003
Dec. 6, 2018 (KR) .................. 10-2018-0156316

(51) Int. Cl.
*H01L 51/00* (2006.01)
*G06F 1/16* (2006.01)
*G09F 9/30* (2006.01)

(52) U.S. Cl.
CPC ........ *H01L 51/0097* (2013.01); *G06F 1/1652* (2013.01); *G09F 9/301* (2013.01); *H01L 51/0017* (2013.01)

(58) Field of Classification Search
CPC ......... H01L 2251/5338; H01L 27/3262; H01L 27/3244; H01L 51/0097; G06F 1/1652; G09F 9/301
See application file for complete search history.

(56) References Cited

U.S. PATENT DOCUMENTS

| | | | |
|---|---|---|---|
| 9,395,070 B2 | 7/2016 | Endo |
| 9,666,428 B2 | 5/2017 | Kawata |
| 9,810,406 B2 | 11/2017 | Endo |
| 10,578,284 B2 | 3/2020 | Endo |
| 10,823,374 B2 | 11/2020 | Endo |

(Continued)

FOREIGN PATENT DOCUMENTS

| | | | |
|---|---|---|---|
| EP | 3 226 072 A1 | 10/2017 |
| EP | 3 333 896 A1 | 6/2018 |

(Continued)

OTHER PUBLICATIONS

European Patent Office, European Search Report and Written Opinion. EP Patent Application No. 19204584.7, dated Mar. 24, 2020, nine pages.

(Continued)

*Primary Examiner* — Bac H Au
(74) *Attorney, Agent, or Firm* — Fenwick & West LLP

(57) ABSTRACT

This present disclosure discloses a display device. The display device may include a bending area and a non-bending area. A structure for improving durability may be included in the bending area. The display device may include a base layer having one or more first regions that can be folded along a predetermined axis, and a second region adjacent to the first regions; and thin-film transistors, organic light-emitting elements and functional layers stacked in the second region of the base layer. The thin-film transistors, the organic light-emitting elements and the functional layers stacked in the second regions are not disposed in the first regions. Instead, the space otherwise occupied by the elements is filled with the filling layer.

15 Claims, 8 Drawing Sheets

(56) References Cited

U.S. PATENT DOCUMENTS

| | | |
|---|---|---|
| 2015/0023031 A1 | 1/2015 | Endo |
| 2015/0177789 A1* | 6/2015 | Jinbo .................. H04M 1/0268 |
| | | 313/511 |
| 2015/0194392 A1 | 7/2015 | Kawata |
| 2016/0273739 A1 | 9/2016 | Endo |
| 2017/0229527 A1 | 8/2017 | Baek et al. |
| 2018/0058665 A1 | 3/2018 | Endo |
| 2018/0097197 A1* | 4/2018 | Han ...................... G06F 1/3265 |
| 2018/0130966 A1* | 5/2018 | Yun .................... H01L 27/3244 |
| 2018/0138442 A1 | 5/2018 | Kim |
| 2018/0197484 A1 | 7/2018 | Moon et al. |
| 2019/0245156 A1* | 8/2019 | Kwon .................. H01L 51/5218 |
| 2020/0284406 A1 | 9/2020 | Endo |

FOREIGN PATENT DOCUMENTS

| | | |
|---|---|---|
| JP | 2007-136890 A | 6/2007 |
| JP | 2015-038609 A | 2/2015 |
| JP | 2015-129830 A | 7/2015 |
| JP | 2019-082553 A | 5/2019 |
| WO | WO 2006/022273 A2 | 3/2006 |
| WO | WO 2018/110529 A1 | 6/2018 |

OTHER PUBLICATIONS

Japan Patent Office, Notice of Reasons for Rejection, JP Patent Application No. 2019-190125, dated Oct. 13, 2020, 19 pages.

* cited by examiner

FLEXIBLE DISPLAY DEVICE

CROSS-REFERENCE TO RELATED APPLICATIONS

This application claims the priority of the Republic of Korea Patent Application No. 10-2018-0126003 filed on Oct. 22, 2018 and the Republic of Korean Patent Application No. 10-2018-0156316 filed on Dec. 6, 2018, the disclosures of which are each incorporated herein by reference in their entirety.

BACKGROUND

Technical Field

The present disclosure relates to a flexible display device.

Description of Related Art

Display devices provide a variety of information graphically on a screen and are the core technology of the era of information and communications. Such display devices are becoming thinner, lighter and easier to carry, along with higher performance. Keeping up with such advances, organic light-emitting display devices are attracting attention which display image by controlling the amount of light emitted from organic light-emitting elements.

An organic light-emitting element can emit light on its own by using a thin emissive layer between electrodes and thus has an advantage in that it can be made thinner Typically, an organic light-emitting display device has a structure in which pixel-driving circuits and organic light-emitting elements are formed on a substrate. As the light emitted from the organic light-emitting elements transmits the substrate or a barrier layer, images are displayed.

Since such an organic light-emitting display device is implemented without a separate light source, it can be easily employed in a flexible, bendable, or foldable display device. A flexible material, such as plastic and a metal foil, is used as the substrate of an organic light emitting display device.

Recently, there is an increasing demand for a display device that can change into a variety of shapes. Accordingly, studies for implementing an organic light-emitting display device as a foldable or rollable display device are ongoing. Unfortunately, existing foldable or rollable display devices still have a lot to be improved due to their structural/material characteristics and limitations.

SUMMARY

In view of the above, an object of the present disclosure is to provide a folding structure of a flexible display device and a structure for improving the durability of the flexible display device.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device may include a bending area and a non-bending area. A structure for improving durability may be included in the bending area. The display device may include a base layer having one or more first regions that can be folded along a predetermined axis, and a second region adjacent to the first regions; and thin-film transistors, organic light-emitting elements and functional layers stacked in the second region of the base layer. The thin-film transistors, the organic light-emitting elements and the functional layers stacked in the second regions are not disposed in the first regions. Instead, the space otherwise occupied by the elements is filled with the filling layer.

Other detailed matters of the exemplary embodiments are included in the detailed description and the drawings.

According to exemplary embodiments of the present disclosure, there is provided a structure capable of reducing defects possibly occurring in a bending portion of a foldable display device. In addition, according to exemplary embodiments of the present disclosure, there is provided a structure capable of improving structural durability of a foldable/rollable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
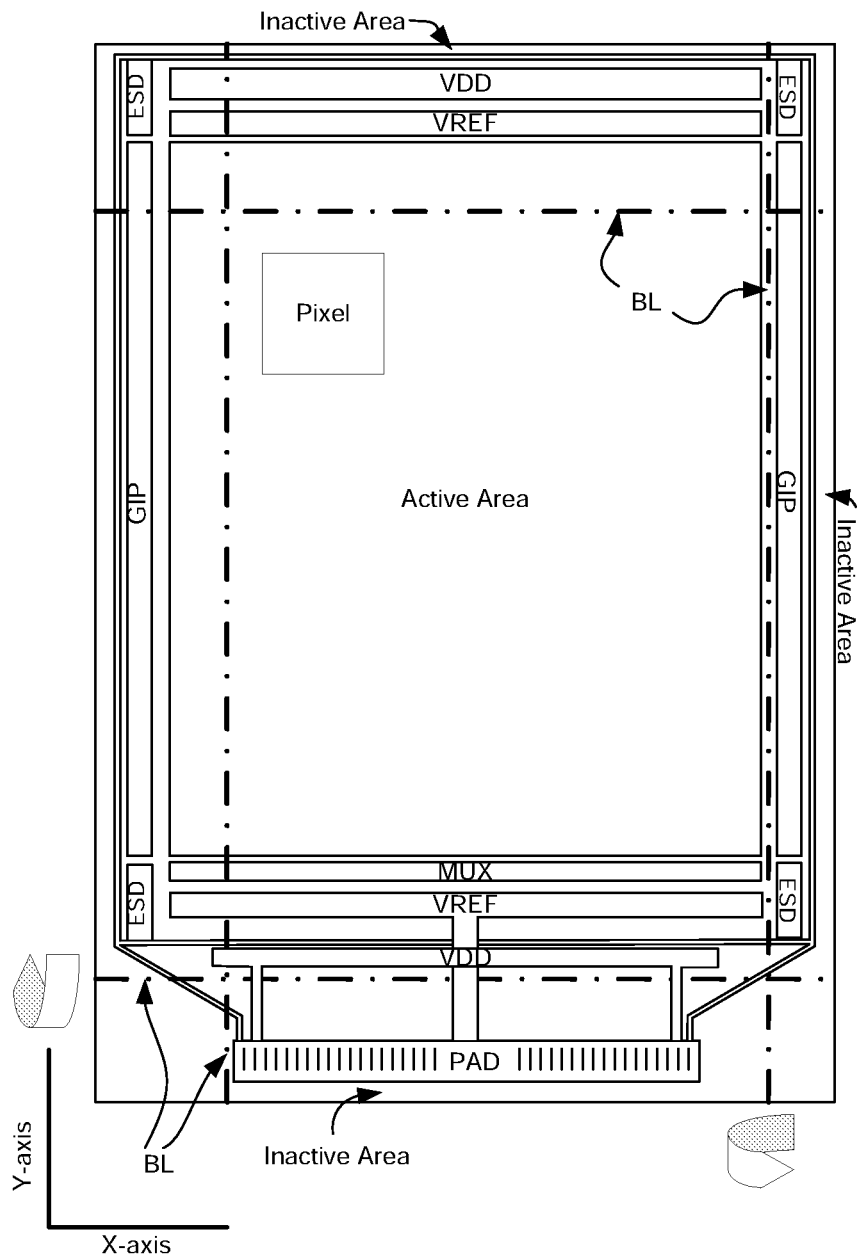
FIG. 1 shows an example of a flexible display device that may be included in an electronic device, according to an embodiment.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

FIG. 1 shows an example of a flexible display device that may be included in an electronic device, according to an embodiment.

The flexible display device refers to a display device having flexibility. A foldable display device, a bendable display device, a rollable display device, and the like may be embodiments of the flexible display device. Referring to FIG. 1, the display device 100 may include at least one active area. For example, a foldable display device may include a plurality of active areas separated from one another in the vertical and/or horizontal direction by bending lines. An array of pixels is formed in the active area. One or more inactive areas may be disposed around the active area. That is to say, the inactive areas may be adjacent to one or more sides of the active area. In FIG. 1, the inactive areas surround a rectangular active area. However, the shape of the active area and the shape/layout of the inactive areas adjacent to the active area are not limited to those shown in FIG. 1. The active area and the inactive areas may have shapes appropriate for the design of an electronic device employing the display device 100. For example, the active area may have a pentagon shape, a hexagon shape, a circle shape, an ellipse shape, etc. In various embodiments, the inactive area may have a linear shape (e.g., be or include a rectangular area).

Each of the pixels in the active area may be associated with a pixel circuit. The pixel circuit may include at least one switching transistor and at least one driving transistor on a backplane. Each pixel circuit may be electrically connected to gate lines and data lines so as to communicate with one or more control circuits disposed in the inactive area, such as a gate driver and a data driver.

The control circuits may be implemented as thin-film transistors (TFTs) in the inactive area, as shown in FIG. 1. The control circuits may be referred to as a gate-in-panel (GIP). In addition, some components such as a data driver IC may be mounted on a separated PCB and may be coupled with a connection interface (a pad/a bump, a pin, etc.) disposed in the inactive area by using a circuit film such as a FPCB (flexible printed circuit board), a COF (chip-on-film), a TCP (tape-carrier-package), etc.

The flexible display device 100 may include a variety of additional elements for generating various signals or for driving pixels in the active area. The additional elements for driving the pixels may include an inverter circuit, a multiplexer, an electro static discharge circuit, etc. The display device 100 may include additional elements associated with other features than driving the pixels. For example, the display device 100 may include additional elements for providing a touch sense feature, a user authentication feature (e.g., fingerprint recognition), a multi-level pressure sense feature, a tactile feedback feature, etc. The above-mentioned additional elements may be disposed in the inactive areas and/or an external circuit connected to the interconnect interface.

Various portions of the display device 100 can be bent along the bending lines BL. The bending lines BL may be extended linearly in one or more directions, e.g., in the horizontal direction (e.g., in the x-axis direction in FIG. 1), in the vertical direction (e.g., in the y-axis direction in FIG. 1), or in the diagonal direction. Accordingly, the display device 100 can be bent in one or more linear directions, e.g., in the horizontal direction, in the vertical direction, in the diagonal direction, or a combination thereof depending on the design choice. The bending lines BL may intersect.

As mentioned, one or more edges of the display device 100 may be bent away from the central portion along the bending lines BL. The bending lines BL may be extended across the center portion or may be extended diagonally from one or more corners of the display device 100. Such a structure may allow the display device 100 to be a foldable display device or a display device having two surfaces on which image can be displayed. Furthermore, by disposing a number of bending lines BL densely, at least a part of the display device can be rolled.

In some exemplary embodiments, a bending portion of the flexible display device 100 may include at least one bending area and an active area capable of displaying an image. Such an active area is hereinafter referred to as an auxiliary active area. That is to say, the bending lines BL may be arranged adjacent to, e.g. surrounding, the auxiliary active area, so that at least some pixels of the active area are included in the bending portion.

Figure 2A:
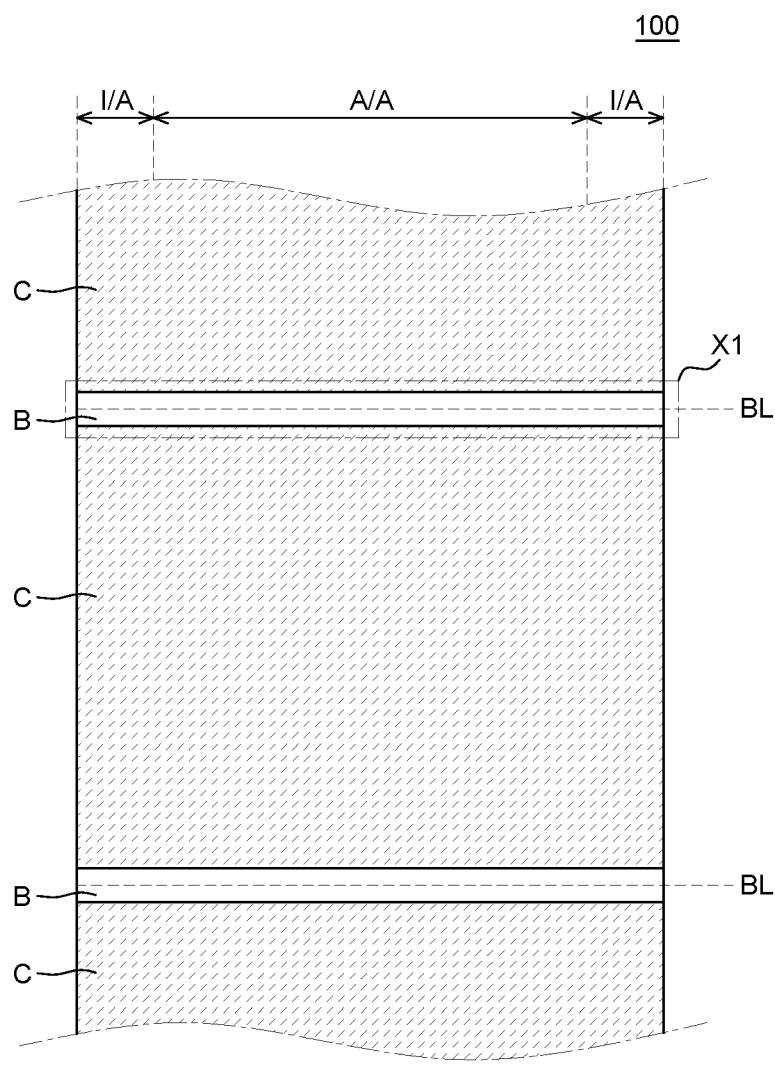
FIGS. 2A to 2C are plan views of a flexible display device according to exemplary embodiments.
Figure 2B:
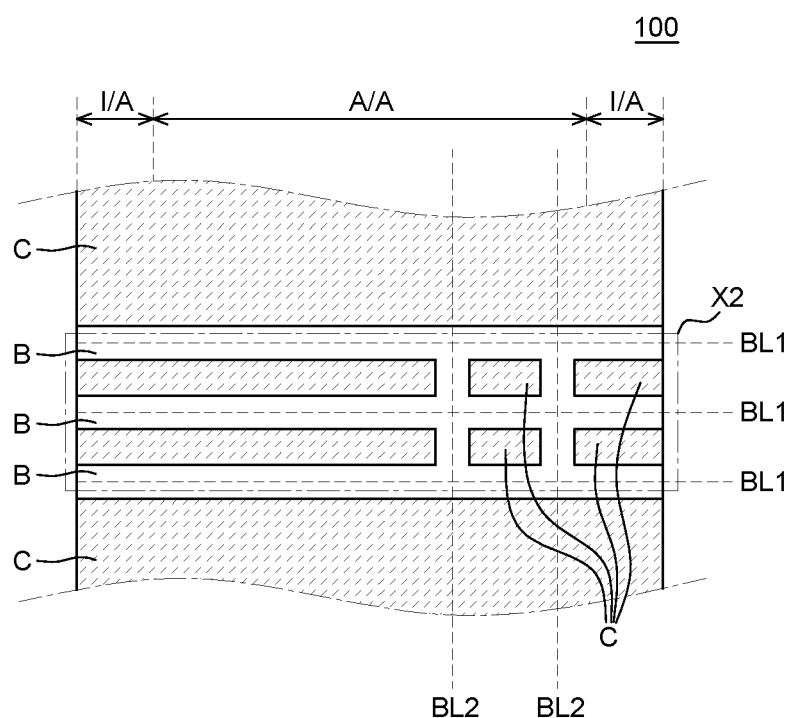
Figure 2C:
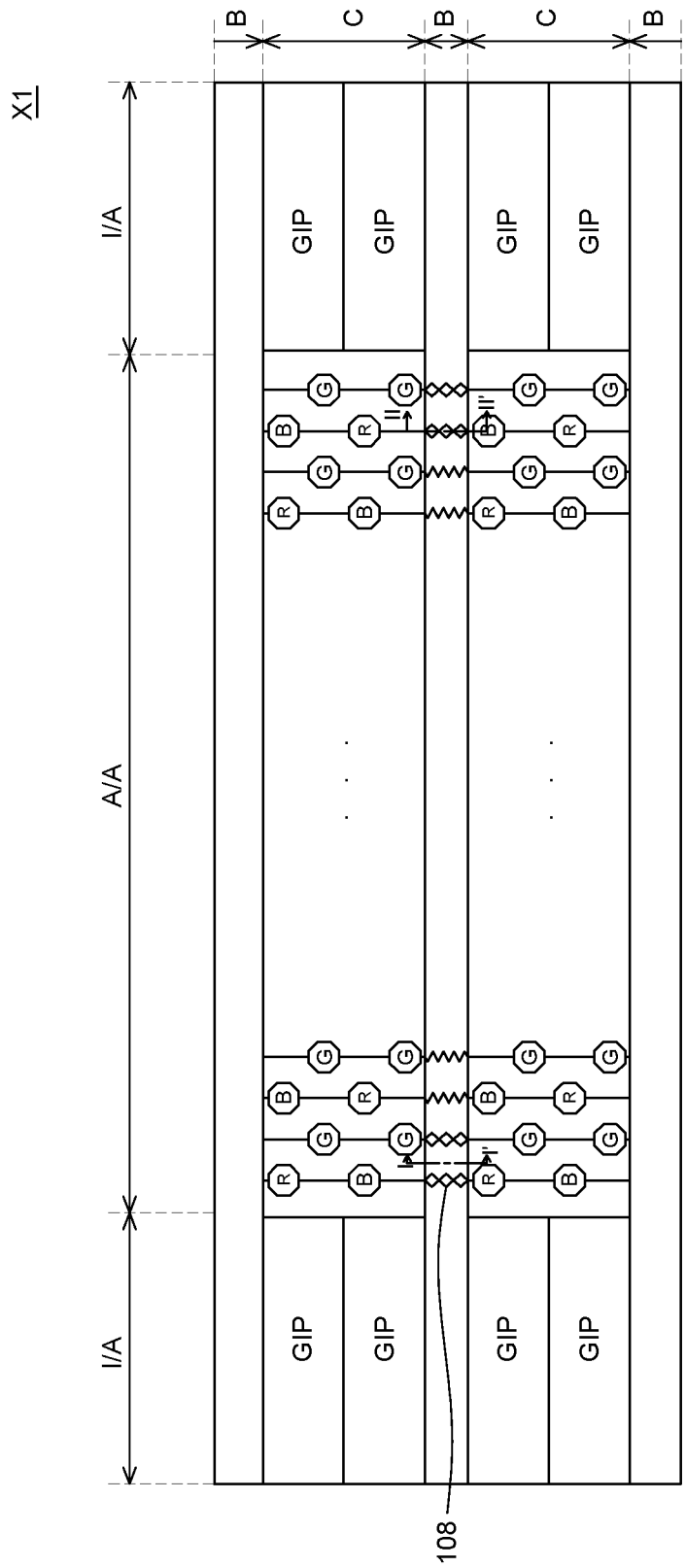

FIGS. 2A to 2C are plan views of a flexible display device according to exemplary embodiments of the present disclosure.

In the following description, the flexible display device according to the exemplary embodiment of the present disclosure including the active areas will be described, assuming that the display device is an organic light-emitting display device as an example. The flexible display device 100 has a structure for improving the durability disposed along the bending lines BL. The structure for improving durability allows an organic light-emitting display device to be more appropriately employed used as a foldable or rollable display device.

Previously, existing foldable or rollable display devices have a lot to be improved due to their structural/material characteristics and limitations. For example, as the thickness of a foldable or rollable display device is reduced, the bending curvature increases, but damage (cracks, etc.) to the inorganic layer or metallic element in the bending portion is more likely to be generated and propagated. In order to overcome such a problem, it has been proposed to pattern the bending portion. However, the strength of the display device is weakened. Accordingly, it is very difficult to implement a display device with a desired thickness while achieving flexibility.

In view of the above, the inventors of the present disclosure have devised a novel structure that can reduce the folding radius of a foldable or rollable display device without weakening the strength. The structure may include an etched portion provided along a bending area B and a filling layer to fill the etched portion.

FIG. 2A shows a plan view of a display device according to an exemplary embodiment of the present disclosure. In the plan view of FIG. 2A, the upper and lower portions of the flexible display device of FIG. 1 are partially omitted.

In the active area A/A of the display device 100, a base layer may be disposed, on which thin-film transistors, organic light-emitting elements, and functional layers (an insulating layer, a planarization layer, etc.) may be formed. The thin-film transistors 102, 104, 106 and 108, the organic light-emitting elements 112, 114 and 116, and various functional layers are disposed on the active area A/A. The thin-film transistors are disposed on a surface (first surface) of the base layer 101. When the base layer 101 is made of plastic, it may be referred to as a plastic film or a plastic substrate. Organic light-emitting diodes are disposed above the thin-film transistors. The organic light-emitting diodes are controlled by a pixel circuit and a control circuit implemented on the base layer 101 and another external driving circuit connected to a connection interface on the base layer 101. Each of the organic light-emitting diodes includes a layer of an organic light-emitting material that emits light of a particular color (e.g., red, green or blue). In some exemplary embodiments, the layer of organic light-emitting material may have a stack structure capable of emitting white light (essentially a combination of light of different colors).

In addition, control circuit (for example, a GIP (gate-in-panel) or the like) blocks disposed on the base layer, related elements, various signal lines, and the like may be disposed in the inactive area I/A of the display device 100.

The base layer of the display device 100 may be divided into first regions B and second regions C. The first regions B can be bent along predetermined axes BL. More than one first region B may be formed in the display device. The second regions C are adjacent to the first regions B and are less bent than the first regions B. For a flexible display device, the second regions C are substantially not bent. That is to say, the second regions C include an area that is configured like the active area of typical display devices while the first regions B are disposed between the second regions C and can be folded. The first regions B and the second regions C may be defined not only in the active area A/A but also in the inactive area I/A as shown in the drawings. Accordingly, the first regions B and the second regions C may include the active area A/A as well as the inactive area I/A at both side ends.

The first regions B are actually bent when the display device is deformed (folded or rolled), and thus receive a large stress. Therefore, various stress reduction structures are applied to the first regions B. To this end, at least some of the constituent elements stacked in the second regions C are not disposed in the first regions B. For example, the thin-film transistors, the organic light-emitting diodes and/or related functional layers (e.g., a buffer layer, an insulating layer, a planarization layer, etc.) may not be disposed in the first regions B. That is to say, in order to facilitate the bending, only essential layers may be disposed in the first regions B. For example, in the bending area B, the thin-film transistors, the organic light-emitting elements, and/or the control circuit and the related functional layers may all be removed, and only the base layer may remain of these layers of region C. The functional layers may be removed via a series of etching processes. The empty space from which the functional layers are removed may be filled with the filling layer. The filling layer may have a sufficient elasticity to withstand the stress applied to the first regions B. As such, by forming a kind of slits on one surface of the display device and filling the spaces between the slits with a material having elasticity, the stress is concentrated on the slits, so that damage to the rest of the portions is reduced. In addition, the portion thinned by patterning is reinforced by the filling layer, and thus the overall strength of the display device can be increased. By virtue of the structure for improving durability of the bending portion, a display device capable of folding inward/outward can be implemented more easily.

The first regions B may be arranged in stripes parallel to the bending axes BL, as shown in FIG. 2A. Alternatively, the first area B may be arranged in a mesh pattern parallel to two different bending axes BL1 and BL2 as shown in FIG. 2B. That is to say, the first regions B may be extended in two or more different directions. Then, the second regions may be divided into a larger number of sub-regions. The bending axes may extend along the first regions B, and may in various embodiments additionally extend along second regions C.

The number and pitch of the first regions B may be designed in consideration of the bending characteristic of the flexible display device. For example, a rollable display device may include a larger number of first regions B than a foldable display device that folds only once. In addition, if a rollable display device requires a smaller curvature radius, the first regions may be arranged at a narrower pitch.

The width of the first regions B is correlated with the folding radius, and thus it can be determined based on the folding radius. On the other hand, if the width of the first regions B is too large, there may be a problem in visibility. Accordingly, the width of the first regions B may be determined so that it dos not affect a user's visibility.

FIG. 2C is an enlarged view of portion X1 in FIG. 2A. As described above, the pixels R, G and B of the active area and the control circuit (e.g., GIP) of the inactive area may be included in the second regions C.

The first regions B include electrically conductive lines (e.g. electrodes) 108 that connect between the pixels R, G and B disposed in the second regions C with the first regions B therebetween. The conductive lines 108 may have a shape that reduces stress applied when the display device is bent or folded. For example, in addition to the shape shown in FIG. 2C, the conductive lines may be implemented in a shape appropriate for stress distribution such as a wave shape, a square wave shape and a sawtooth wave shape.

Figure 3:
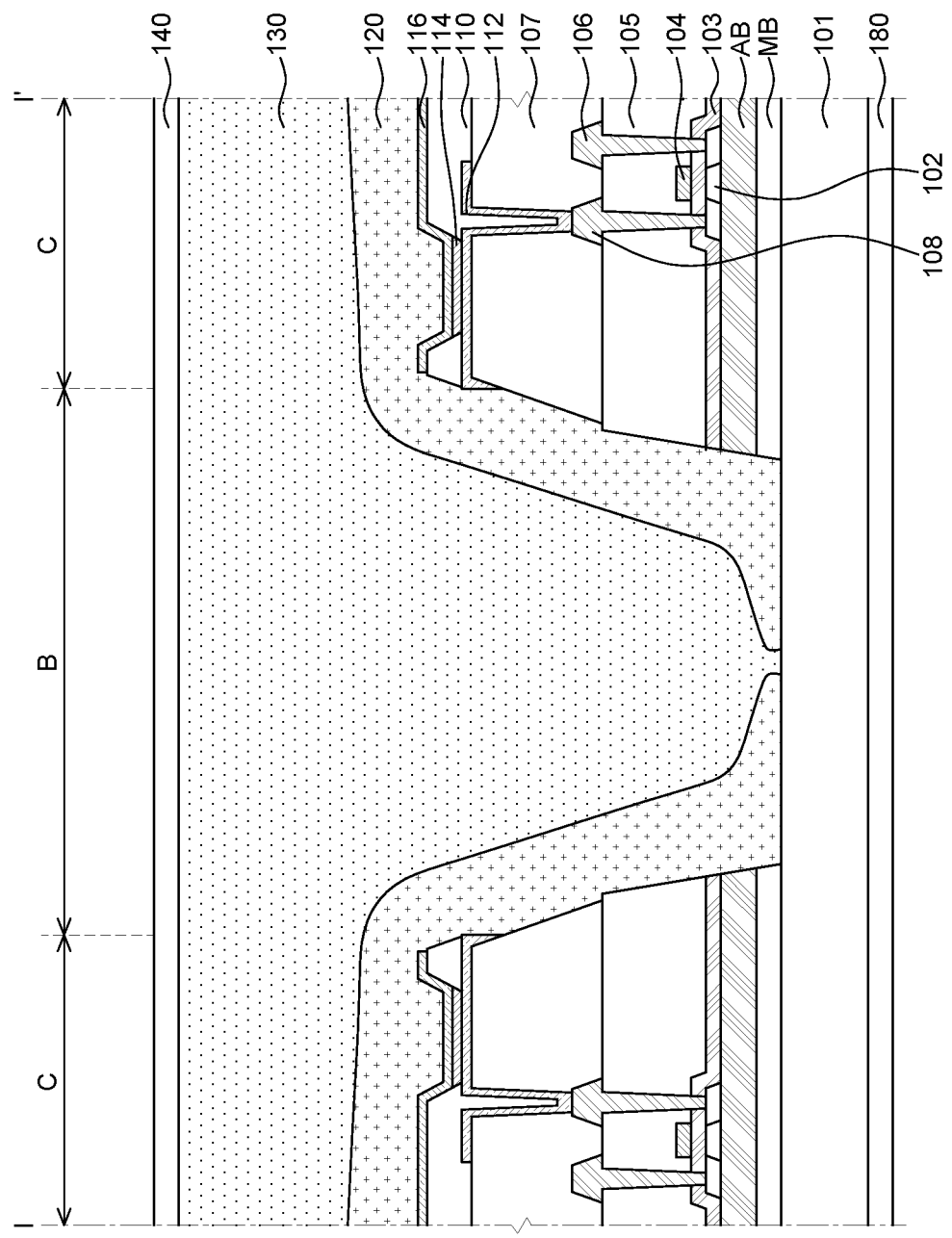
FIG. 3 is a cross-sectional view taken along line I-I' of FIG. 2C, according to an embodiment.
Figure 4:
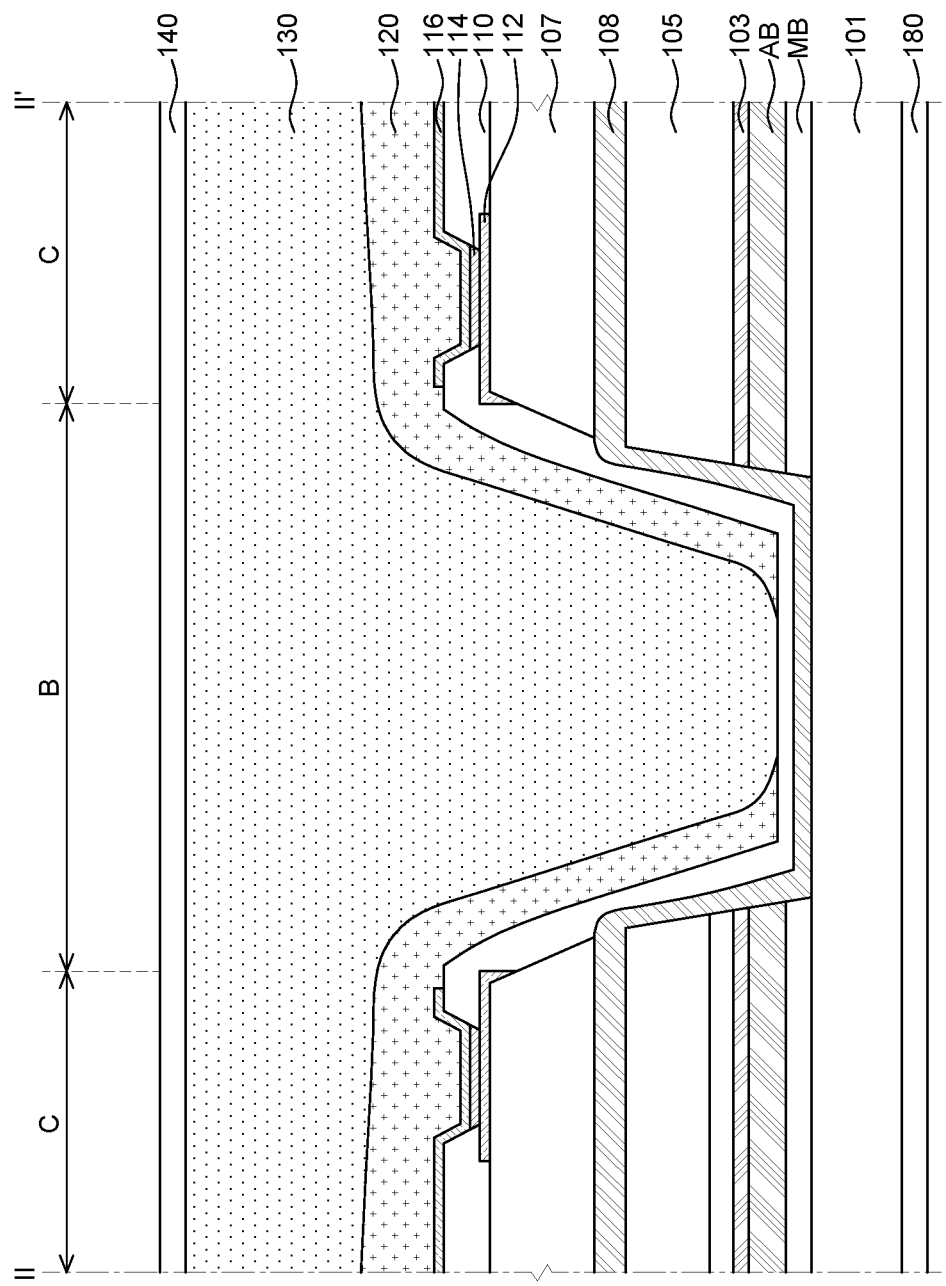
FIG. 4 is a cross-sectional view taken along line II-II' of FIG. 2C, according to an embodiment.

FIGS. 3 and 4 are cross-sectional views showing a particular part of FIG. 2C.

FIG. 3 is a cross-sectional view taken along line I-I' of FIG. 2C, according to an embodiment. The organic light-emitting display device 100 includes the structure for improving durability.

In the organic light-emitting display device 100, thin-film transistors 102, 104, 106 and 108, the organic light-emitting elements 112, 114 and 116 and various functional layers are disposed on the base layer 101.

The base layer 101 supports various elements of the organic light-emitting display device 100. The base layer 101 may be made of a transparent, insulative material such as glass, plastic, etc. The term substrate (array substrate) may also refer to the substrate itself as well as elements and functional layers formed thereon, e.g., a switching TFT, a driving TFT connected to the switching TFT, an organic light-emitting element connected to the driving TFT, a protective film, etc.

A buffer layer (MB, AB) may be disposed on the base layer 101. The buffer layer is a functional layer for protecting a thin-film transistor (TFT) from impurities such as alkali ions that may leak from the base layer 101 or the underlying layers. The buffer layer may be made of silicon oxide (SiOx), silicon nitride (SiNx), or multiple layers thereof.

A thin-film transistor is disposed on the base layer 101 or the buffer layer. The thin-film transistor may be formed by sequentially stacking a semiconductor layer 102, a gate insulating layer 103, a gate electrode 104, an interlayer dielectric layer 105, a source electrode 106, and a drain electrode 108. The semiconductor layer 102 is disposed on the base layer 101 or the buffer layer. The semiconductor layer 102 may be made of a polysilicon (p-Si), a predetermined region of which may be doped with impurities. In addition, the semiconductor layer 102 may be made of amorphous silicon (a-Si) or may be made of a variety of organic semiconductor line materials such as pentacene. Further, the semiconductor layer 102 may be made of oxide as well. The gate insulation film 103 may be formed of an insulating material, e.g. of an insulative inorganic material such as a silicon oxide (SiOx) and/or a silicon nitride (SiNx), or of an insulative organic material. The gate electrode 104 may be made of a variety of conductive materials such as magnesium (Mg), aluminum (Al), nickel (Ni), chrome (Cr), molybdenum (Mo), tungsten (W), gold (Au) or an alloy thereof.

The interlayer dielectric layer 105 may be formed of an insulative material such as a silicon oxide (SiOx) and/or a silicon nitride (SiNx) or may be made of an insulative organic material. By selectively removing the interlayer dielectric layer 105 and the gate insulation film 103, a contact hole may be formed via which a source region and a drain region are exposed.

The source electrode 106 and the drain electrode 108 are made of a material for an electrode and are made up of a single layer or multiple layers on the interlayer dielectric layer 105.

A planarization layer 107 may be disposed above the thin-film transistor. The planarization layer 107 protects the thin-film transistor and provides a flat surface over it. The planarization layer 107 may have a variety of forms. For example, the planarization layer 107 may be made of an organic insulation film such as BCB (benzocyclobutene) and acryl or may be made of an inorganic insulation film such as silicon nitride (SiNx) film and silicon oxide (SiOx) film. In addition, the planarization layer 107 may be made up of a single layer, a double layer, or a multi-layer.

The organic light-emitting element may be formed by stacking a first electrode 112, an organic emission layer 114 and a second electrode 116 in this order. That is to say, the organic light-emitting element may include the first electrode 112 formed on the planarization layer 107, the organic emission layer 114 disposed on the first electrode 112, and the second electrode 116 disposed on the organic emission layer 114.

The first electrode 112 is electrically connected to the drain electrode 108 of the driving thin-film transistor via the contact hole. In the case where the organic light-emitting display device 100 is of top-emission type, the first electrode 112 may be made of an opaque conductive material having high reflectivity. For example, the first electrode 112 may be made of silver (Ag), aluminum (Al), gold (Au), molybdenum (Mo), tungsten (W), chrome (Cr) or an alloy thereof.

A bank 110 is formed in the rest of the area except an emission area. Accordingly, the bank 110 has a bank hole corresponding to the emission area, via which the first electrode 112 is exposed. The bank 110 may be made of either an inorganic insulative material such as silicon nitride (SiNx) layer and silicon oxide (SiOx) layer or an organic insulative material such as BCB (Benzocyclobutene), acryl-based resin, or imide-based resin.

The organic emission layer 114 is disposed on the first electrode 112 exposed via the hole of the bank 110. The organic emission layer 114 may include an emissive layer, an electron injection layer, an electron transport layer, a hole transport layer, a hole injection layer, etc. The organic emission layer may be made up of a single emissive layer emitting light of a color or may be made up of a plurality of emissive layers to emit white light.

The second electrode 116 is disposed on the organic emission layer 114. In the case where the organic light-emitting display device 100 is of top-emission type, the second electrode 116 is made of a transparent, conductive material such as indium tin oxide (ITO) or indium zinc oxide (IZO), such that light generated in the organic emission layer 114 exits upwardly through the second electrode 116.

A second electrode 116 is disposed on the encapsulation layer 120. The encapsulation layer 120 blocks oxygen and moisture from permeating from the outside to thereby suppress oxidation of luminous material and the material of the electrodes. If an organic light-emitting element is exposed to moisture or oxygen, the emission area may shrink, i.e., pixel shrinkage may take place or dark spots may appear in the emission area. The passivation layer and/or the encapsulation layer may be formed as an inorganic layer made of glass, metal, aluminum oxide (AlOx) or silicon (Si)-based material or may be formed by stacking organic layers and inorganic layers alternately. The inorganic layers serve to block permeation of moisture or oxygen, and the organic layers serve to provide flat surface on the inorganic layers. By forming the encapsulation layer of multiple thin film layers, the paths in which moisture or oxygen may possibly permeate become longer and more complicated than those of a single layer, to make permeation moisture/oxygen into the organic light-emitting elements difficult. The encapsulation layer 120 may be disconnected in the first regions. Since the encapsulation layer 120 includes the inorganic layer for blocking permeation of moisture, it is desired that the encapsulation layer 120 is disposed in the first regions B as little as possible. Therefore, the encapsulation layer does not cover at least a part of the first regions B.

A touch layer for sensing a user's touch input may be disposed on the upper surface of the encapsulation layer 120. A separate layer including touch sensing electrodes and/or other elements associated with touch input sensing may be provided in the display device 100 as desired. The touch sensing electrodes (e.g., touch driving/sensing electrodes) may be formed of a transparent conductive material including indium tin oxide, a carbon-based material such as graphene, a carbon nanotube, a conductive polymer, a hybrid material made of a mixture of various conductive/ non-conductive material, etc. In addition, a metal mesh such as an aluminum mesh and a silver mesh may be used as the touch sensing electrodes.

A cover layer 140 may be disposed on the encapsulation layer 120. The cover layer 140 may be used to protect the display device 100 and may be, for example, a cover glass. A polarizing layer (e.g., coated-pol) may be integrated into the cover layer 140 in order to control display characteristics (e.g., external light reflection, color accuracy, brightness, etc.).

At least one support layer 180 may be disposed under the base layer 101 to increase the strength and/or robustness at a certain portion of the foldable display device 100. The support layer 180 is attached to the surface (second surface) of the base layer 101 opposite to the first surface where the organic light-emitting elements are disposed. The support layer 180 may be implemented as a thin plastic film made of: polyethylene naphthalate (PEN), polyethylene terephthalate (PET), polyethylene ether phthalate, polycarbonate, polyarylate, polyether imide, polyether sulfonate, polyimide, polyacrylate or other appropriate combinations of polymers. Other materials that can be appropriately used to form the support layer 180 include thin glass, a metal foil shielded with a dielectric material, multiple polymer layers, a polymer film in which polymeric materials are combined with nanoparticles or microparticles. An adhesive layer (not illustrated) may be disposed between the encapsulation layer 120 and the cover layer 140, and between the base layer 101 and the support layer 180. The adhesive layer may be a thermosetting or a naturally-curable adhesive. For example, the adhesive layer may be made of a material such as OCA (optically clear adhesive) or B-PSA (barrier pressure sensitive adhesive).

According to an exemplary embodiment of the present disclosure, the organic light-emitting display device 100 includes a base layer 101 having one or more first regions B that can be folded along a predetermined axis, and a second region C adjacent to the first regions B; and thin-film transistors, organic light-emitting elements and functional layers stacked in the second region C of the base layer. The thin-film transistors, the organic light-emitting elements and the functional layers stacked in the second regions C are not disposed in the first regions B. Instead, the space otherwise occupied by the elements is filled with the filling layer 130.

In the first regions B, the thin-film transistors, the organic light-emitting elements and the related functional layers of the second regions C are etched away. That is to say, the first regions B have a reduced thickness so that it can be bent more easily. Materials that may cause cracks to occur/propagate have been removed in advance from the first regions B. In addition, the first regions B are filled with an elastic material after the layers (materials) have been removed, to reinforce the strength after patterning.

The second regions C may include the active area and the inactive area on its both side ends. For example, the second regions C may include the control circuit (e.g., GIP) blocks on at least one of the both side ends. The encapsulation layer 120 may be disconnected in the second regions C as shown in FIG. 3. That is to say, the encapsulation layer 120 may be formed so that it does not cover all or a part of the second regions.

The filling layer 130 may be made of a material having a sufficient elasticity to withstand the stress applied to the first regions B and may be a polymer such as polyimide or a resin. The filling layer 130 may have an elastic modulus of 2 to 15 megapascal (MPa).

The filling layer 130 may be a material in a liquid state, a sol state, or a gel state. In such case, the filling layer 130 may be made of an inert material that is chemically stable. For example, the filling layer 130 may be made of a material such as polydimethylsiloxane (PDMS) and a getter. The filling layer 130 made of the PDMS may have an elastic modulus of approximately 13 to 14 MPa and a viscosity of 50 to 1000 centipoise (cps). The filling layer 130 may have a light transmittance of 90% or higher in order not to decrease the visibility. Furthermore, the filling layer 130 may include liquid-crystal molecules and may also function as a polarizer. In such case, the overall thickness of the display device can be further reduced, so that the foldable/rollable characteristics are improved.

Figure 5A:
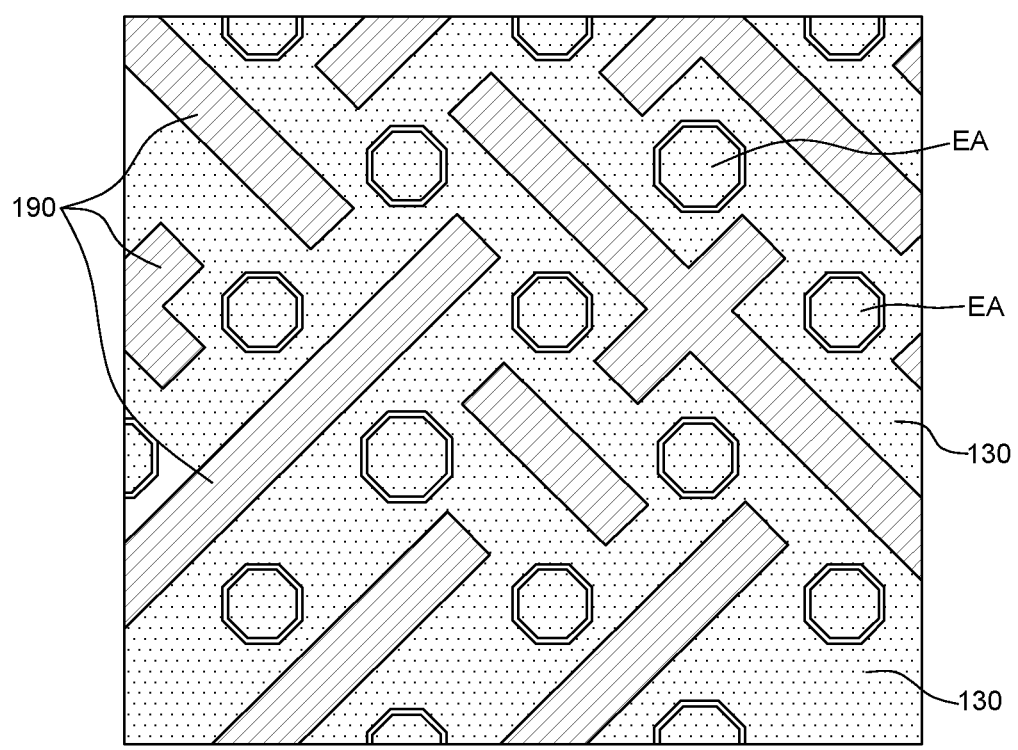
FIG. 5A is a plan view and FIG. 5B is a cross-sectional view of a flexible display device, according to exemplary embodiments.
Figure 5B:
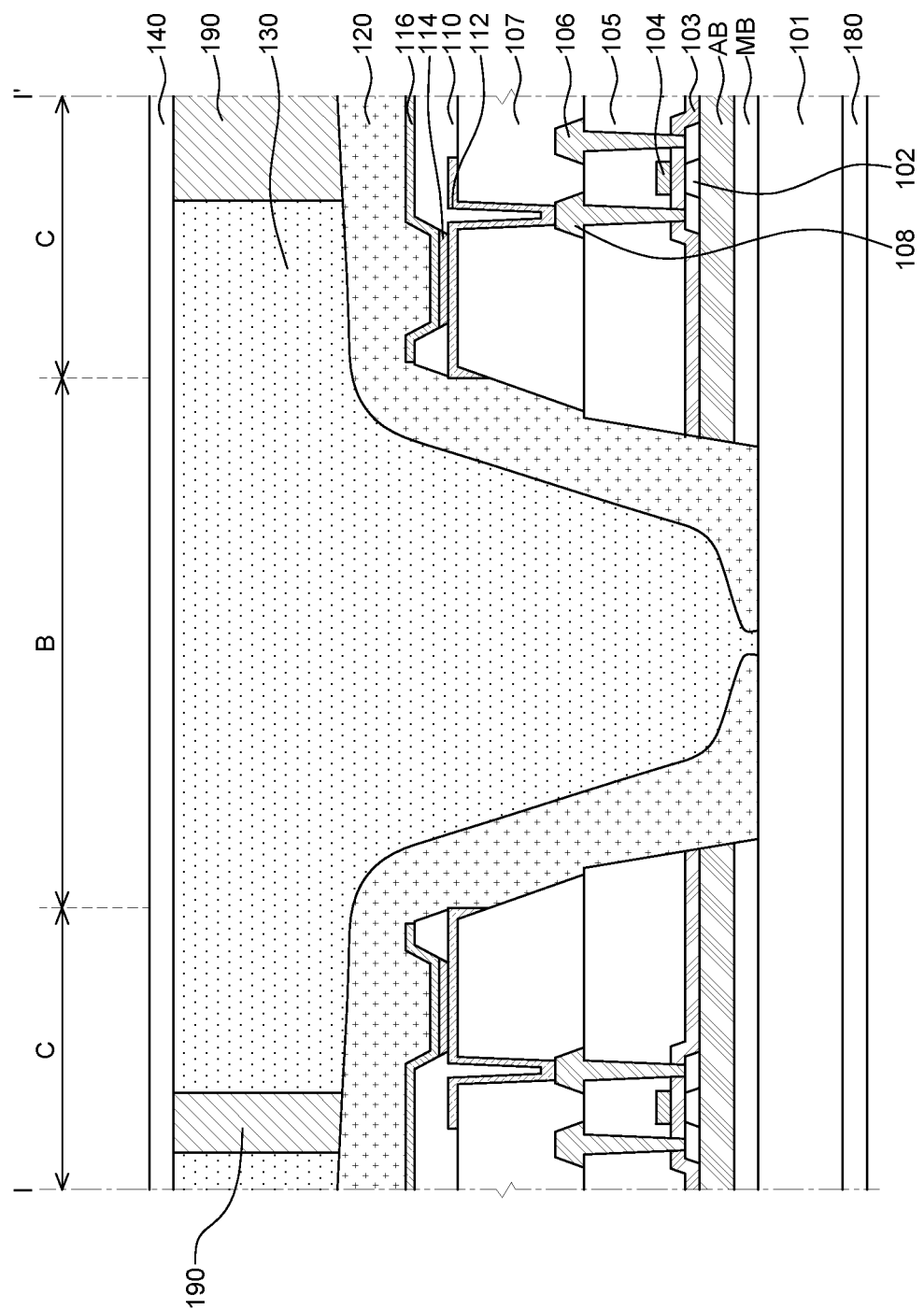

Auxiliary structure 190 shown in FIGS. 5A and 5B may be further disposed when the filling layer 130 is in a liquid, a sol, or a gel state. The auxiliary structure 190 are disposed to maintain the shape (height, distribution, etc.) of the filling layer when the display device is folded or rolled. Specifically, the auxiliary structure 190 is disposed in the bank except openings EA to control the filling layer so that it does not move too much. The auxiliary structure 190 may be formed of a material such as a low-temperature photo acryl (PAC) above the bank 110.

The filling layer 130 may cover not only the first regions B but also the upper portion of the second regions C as shown in FIG. 3.

FIG. 4 is a cross-sectional view taken along line II-II' of FIG. 2C, according to an embodiment. Although no thin-film transistor is shown in FIG. 4, a thin-film transistor may be disposed at that position in some implementations. The functional layers shown in FIG. 4 are identical to those described above with reference to FIG. 3. The portion shown in FIG. 4 includes electric conductive lines 108 that connect between the pixels R, G and B disposed in the second regions C with the first region B therebetween. The conductive lines 108 may have a shape that reduces stress applied when the display device is bent or folded. For example, in addition to the diamond shape shown in FIG. 2C, the conductive lines may be implemented in a shape appropriate for stress distribution such as a wave shape, a triangular wave shape and a square wave shape.

The conductive lines 108 may be made of the same material as the source or drain electrode of the thin-film transistor. The conductive lines 108 may be formed via the process of forming the source or drain electrodes.

By virtue of the structure for improving the durability formed in the bending areas, the display device 100 can be reliably operated when it is folded.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a base layer having one or more first regions that can be folded along a predetermined axis, and a second region adjacent to the first regions;
   thin-film transistors, organic light-emitting elements and insulating layers stacked in the second region of the base layer; and
   an encapsulation layer on the organic light-emitting elements of the second region and the base layer of the one or more first regions,
   wherein the one or more first regions comprise a filling layer on the encapsulation layer, and
   wherein the thin-film transistors, the organic light-emitting elements, and the insulating layers are not disposed in the one or more first regions and the one or more first regions are filled with the filling layer instead.

2. The display device of claim 1, wherein the encapsulation layer is disconnected in the first regions.

3. The display device of claim 2, wherein the filling layer is a material having an elastic modulus of 2 MPa to 15 MPa.

4. The display device of claim 2, wherein the filling layer is filled in the disconnected region of encapsulation layer in the first regions.

5. The display device of claim 1, wherein the one or more first regions are formed by etching the thin-film transistors, the organic light-emitting elements, and the insulating layers in the second region.

6. The display device of claim 1, wherein the second region comprises an active area and inactive areas on both side ends of the active area.

7. The display device of claim 6, wherein the second region comprises a control circuit block at two side ends thereof.

8. The display device of claim 1, wherein the one or more first regions comprise conductive lines connecting between pixels in the second regions spaced apart from each other with the one or more first regions therebetween.

9. The display device of claim 8, wherein the conductive lines have a shape that reduces stress applied when the first regions are bent or folded.

10. The display device of claim 1, wherein the one or more first regions are extended in two different directions.

11. The display device of claim 1, wherein the filling layer is a material in a liquid state, a solid state, or a gel state.

12. The display device of claim 11, wherein the filling layer is made of polydimethylsiloxane.

13. The display device of claim 12, wherein the filling layer has an elastic modulus of 13 MPa to 14 MPa and a viscosity of 50 cps to 1,000 cps.

14. The display device of claim 11, wherein the filling layer further comprises liquid-crystal molecules.

15. The display device of claim 11, wherein a bank is on a top layer of the insulating layers in the second region, and wherein auxiliary structure for controlling movement of the filling layer are provided above the bank.

* * * * *